(12) United States Patent  
Mikhemar et al.

(10) Patent No.: US 9,154,170 B2  
(45) Date of Patent: *Oct. 6, 2015

(54) TIA-TO-ADC INTERFACE WITH LOW-NOISE AND A WIDE-RANGE OF PASSIVE GAIN CONTROL

(71) Applicant: BROADCOM CORPORATION, Irvine, CA (US)

(72) Inventors: Mohyee Mikhemar, Aliso Viejo, CA (US); Amir Hadji-Abdolhamid, Aliso Viejo, CA (US); Hooman Darabi, Laguna Niguel, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/622,750

(22) Filed: Feb. 13, 2015

(65) Prior Publication Data

US 2015/0162940 A1   Jun. 11, 2015

Related U.S. Application Data

(63) Continuation of application No. 13/719,091, filed on Dec. 18, 2012, now Pat. No. 8,989,688.

(51) Int. Cl.

| | |
|---|---|
| *H04B 1/06* | (2006.01) |
| *H04B 1/12* | (2006.01) |
| *H04B 1/18* | (2006.01) |
| *H03F 1/22* | (2006.01) |
| *H03F 3/195* | (2006.01) |
| *H03F 3/45* | (2006.01) |
| *H03G 3/00* | (2006.01) |
| *H03F 3/19* | (2006.01) |
| *H03G 3/18* | (2006.01) |
| *H03H 7/01* | (2006.01) |
| *H03H 7/06* | (2006.01) |

(52) U.S. Cl.
CPC ............... *H04B 1/123* (2013.01); *H03F 1/223* (2013.01); *H03F 3/19* (2013.01); *H03F 3/195* (2013.01); *H03F 3/45179* (2013.01); *H03F 3/45475* (2013.01); *H03G 3/00* (2013.01); *H03G 3/18* (2013.01); *H03H 7/0138* (2013.01); *H03H 7/06* (2013.01); *H03H 7/17* (2013.01); *H04B 1/18* (2013.01); *H03F 2200/165* (2013.01); *H03F 2200/294* (2013.01); *H03F 2200/336* (2013.01); *H03F 2200/451* (2013.01); *H03F 2203/45394* (2013.01); *H03F 2203/45512* (2013.01); *H03F 2203/45528* (2013.01); *H03F 2203/45631* (2013.01); *H03F 2203/45686* (2013.01); *H03F 2203/45702* (2013.01)

(58) Field of Classification Search
CPC ....... H04B 1/123; H03G 3/18; H03H 7/0138; H03H 7/06; H03H 7/17; H03F 3/19; H03F 2200/451; H03F 2200/294; H03F 2200/165
USPC .......................................................... 455/293
See application file for complete search history.

(56) References Cited

U.S. PATENT DOCUMENTS

2008/0139159 A1* 6/2008 Ojo et al. .................. 455/313
2011/0300818 A1* 12/2011 Mirzaei et al. ............ 455/127.2

*Primary Examiner* — Ajibola Akinyemi
(74) *Attorney, Agent, or Firm* — McDermott Will & Emery LLP

(57) ABSTRACT

A circuit for a low-noise interface between an amplifier and an analog-to-digital converter (ADC) may comprise a capacitor element having a capacitance of C coupled between a first and second output node of the amplifier. A resistor circuit coupled between the capacitor element and input nodes of the ADC. A desired value $R_L$ for a load resistance of the amplifier is provided by selecting suitable initial values for resistances of the resistor circuit. A desired bandwidth for the at least one amplifier is achieved by selecting a value of the capacitance C based on the desired value $R_L$ for the load resistance.

20 Claims, 4 Drawing Sheets

TIA-TO-ADC INTERFACE WITH LOW-NOISE AND A WIDE-RANGE OF PASSIVE GAIN CONTROL

CROSS-REFERENCE TO RELATED APPLICATIONS

This is a continuation application of U.S. patent application Ser. No. 13/719,091 filed Dec. 18, 2012, which is incorporated herein by reference in its entirety. This application claims the benefit of priority under 35 U.S.C. §120 from U.S. patent application Ser. No. 13/719,091.

TECHNICAL FIELD

The present description relates generally to radio frequency (RF) communications, and more particularly, but not exclusively, to a low-noise TIA-to-ADC interface with wide range of passive gain control.

BACKGROUND

As the number of wireless standards and the range of frequencies of wireless communications continue to increase, there is an increasing need for communication receivers that are capable of handling multiple wireless standards spanning a wide range of frequencies. Also, as the number of wireless devices and the amount of wireless communications taking place increase, the communication receivers may have to be able to function satisfactorily in the presence of large amounts of noise and interference.

Further, the multitude of battery operated wireless devices has created a demand for extremely low-power transceivers to increase the handset talk time and to reduce the battery size and ultimately the cost. Meanwhile, the noise and linearity requirements are becoming more stringent to meet the quest for higher data rates with a highly congested spectrum. Typically, implementing linear multi-band low-noise receivers may become more challenging when the design objectives also include lowering the cost and the chip real estate.

Therefore, the need exists for low-cost and small-area low-noise receivers that can satisfy the requirements of multi-band operation.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1A:
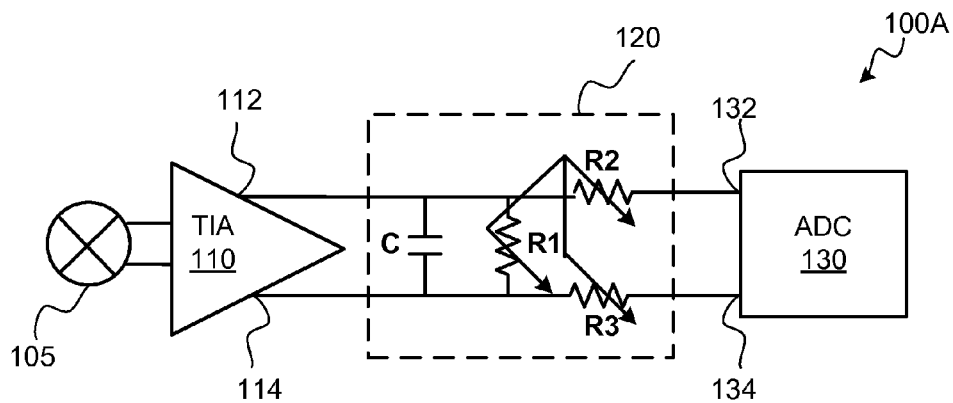
FIG. 1A illustrates an example circuit diagram showing a low-noise interface with a wide-range of gain control between an amplifier and an analog-to-digital converter (ADC) in accordance with one or more implementations.

FIG. 1A illustrates an example circuit diagram 100A showing a low-noise interface 120 with a wide-range gain control between an amplifier 110 and an analog-to-digital converter (ADC) 130 in accordance with one or more implementations of the subject technology. The amplifier 110 may include a tans-impedance amplifier (TIA) coupled to a differential mixer 105 (e.g., of a quadrature mixer). Conventionally, such a TIA may be coupled to an ADC via a buffer circuit or a filter (e.g., an active filter). The buffer circuits may include source-follower circuits and variable-gain amplifiers (VGAs), which may function well in terms of gain control but may be undesirable in low-noise performance applications. The active filter may generate noise and may not be suitable when a wide-range of gain control is desired. The interface 120 may provide a wide-range of gain control (e.g., approximately 30 dB) with a substantially better noise performance compared to the buffer circuits. Additionally, the interface 120 may further offer the benefit of smaller chip area, as the capacitor C may occupy approximately one fourth of area of an equivalent operation amplifier (op-amp) based buffer.

In one or more implementation, the interface 120 may include a capacitor having a capacitance C (hereinafter "capacitor C") coupled between a first output node 112 and a second output node 114 of the TIA 110. A first variable resistor having a resistance R1 (hereinafter "resistor R1") may be coupled in parallel with the capacitor C. A second variable resistor R2 may be coupled between the first output node 112 of the TIA 110 and a first input node 132 of the ADC 130, and a third variable resistor R3 may be coupled between the second output node 114 of the TIA 110 and the second input node 134 of the ADC 130. In one or more aspects of the subject technology, the resistance R2 can be the same as the resistance R3. It is understood that the resistor portion (e.g., R1, R2, and R3) of the interface 120 may act as a resistive load for the TIA 110, which when coupled to the capacitance C may form an output pole of the TIA 110 and thus may control the bandwidth of the TIA 110.

In one or more aspects, the resistances R1, R2, and R3 may be initially selected such that a desirable value (e.g., $R_L$, such as 100 KΩ) for the resistive load is provided (e.g., RL=RL= [R1(R2+R3)]/(R1+R2+R3)). The value of the capacitance C may be selected such that $R_L C$ provides a desired output-pole frequency (e.g., a desired bandwidth) for the TIA 110. For example, for a value of 10 KΩ for resistance $R_L$, and a desired output-pole frequency of 2 MHz, a capacitance value of approximately 8 pf for the capacitance C may be obtained. The wide-range gain control may be achieved by concurrently varying the values of the variable resistances R1, R2 and R3. The gain control via concurrent variation of the resistances R1, R2, and R3 may not, however, affect the output-pole frequency and the desired bandwidth of the TIA 110. For example, if the gain a is defined as the current gain of a divider formed by R1 and the series combination of R2 and R3 (because of the virtual ground at the input circuit of the ADC 130, which is an op-amp), it can be shown that R1=RL/(1−α) and R2=R3=RL/(2α). For instance, for α=1, R1=∞ and R2=RL/2, and for α=0.5, R1=2RL, R2=RL.

Figure 1B:
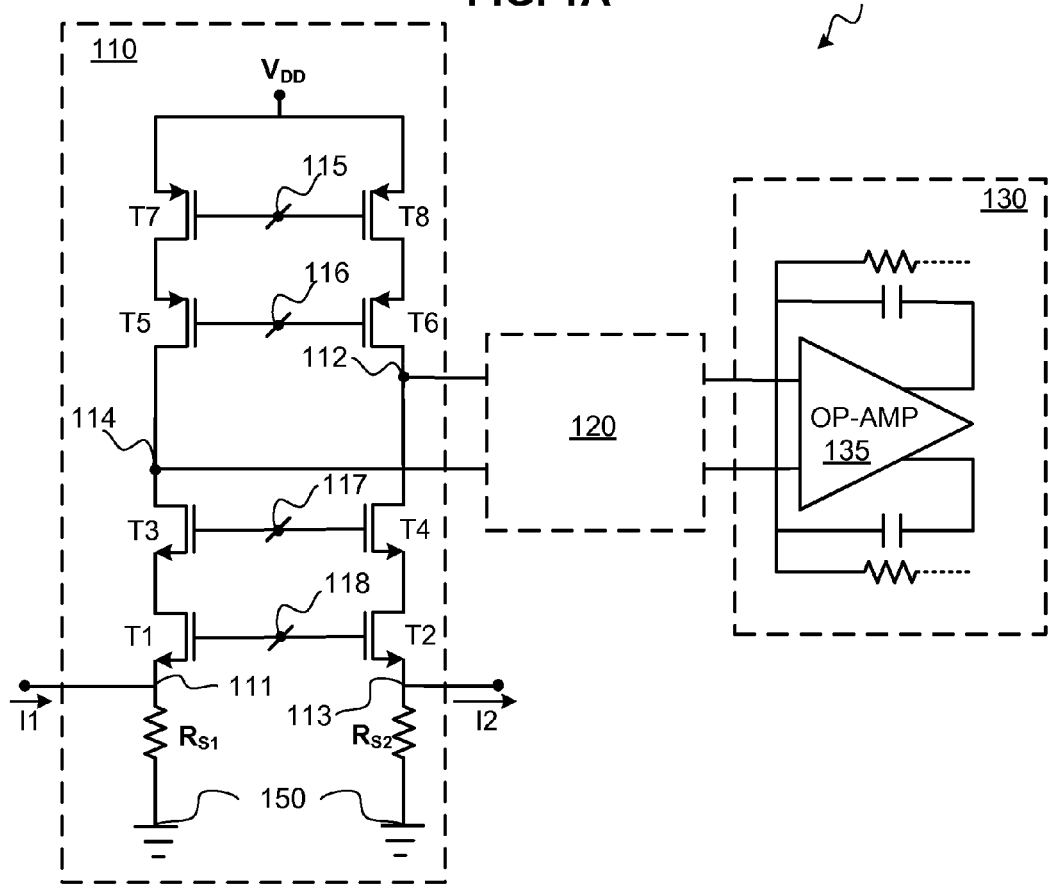
FIG. 1B illustrates an example low-noise trans-impedance amplifier (TIA) interfaced to an ADC with a wide-range passive gain control in accordance with one or more implementations.

FIG. 1B illustrates an example low-noise trans-impedance amplifier (TIA) 110 interfaced to the ADC 130 with a wide-range of passive gain control in accordance with one or more implementations of the subject technology. The schematic and description of the interface 120 is similar to the schematic and description provided with respect to FIG. 1A. Example circuit diagrams for the TIA 110 and ADC 130 are provided here. The TIA 110 may include a differential complementary common-gate TIA coupled to the mixer 105 of FIG. 1A. The TIA 110 may receive input current signals I1 and I2 (e.g., differential input currents) from the mixer 105 and provide a differential output voltage signal across output nodes 112 and 114.

In one or more implementation, the TIA 110 may include cascode NMOS transistor pairs T2-T4 and T1-T3 coupled in a common-gate configuration (e.g., common gates 117 and 118 are coupled to suitable bias circuits, not shown for simplicity) with input currents I1 and I2 entering source nodes 111 and 113 of transistors T1 and T2, which are in turn coupled to ground potential 150, via resistors $R_{S1}$ and $R_{S2}$. Cascode PMOS transistor pairs T5-T7 and T6-T8, coupled to supply voltage $V_{DD}$ (e.g., 1.5V), may form an active load for the common-gate TIA 110. The gates 115 and 116 of the active load transistors are coupled to suitable bias circuits, which are not shown for simplicity. The Active load 120, as described above may provide a wide-range of gain control, without affecting a set bandwidth of the TIA 110, which is determined by an output-pole frequency controlled by the equivalent RC of the interface 120.

The interface 120 may also provide a large source resistance for the ADC 130, thereby improving noise contribution of the ADC 130. In one or more implementations, the ADC 130 may include a ΣΔ-ADC or it may include a biquad filter stage. The biquad filter stage may include an op-amp 135 which can provide a virtual short circuit between nodes 132 and 134 of FIG. 1A, thus the resistor portion (e.g., R1, R2, and R3) of the interface 120 may be viewed as a parallel combination of R1 and (R2+R3). As a result the wide-range gain control of the interface 120, by concurrent variation of resistances of the interface 120, may not affect the output-pole frequency and the desired bandwidth of the TIA 110.

Figure 2B:
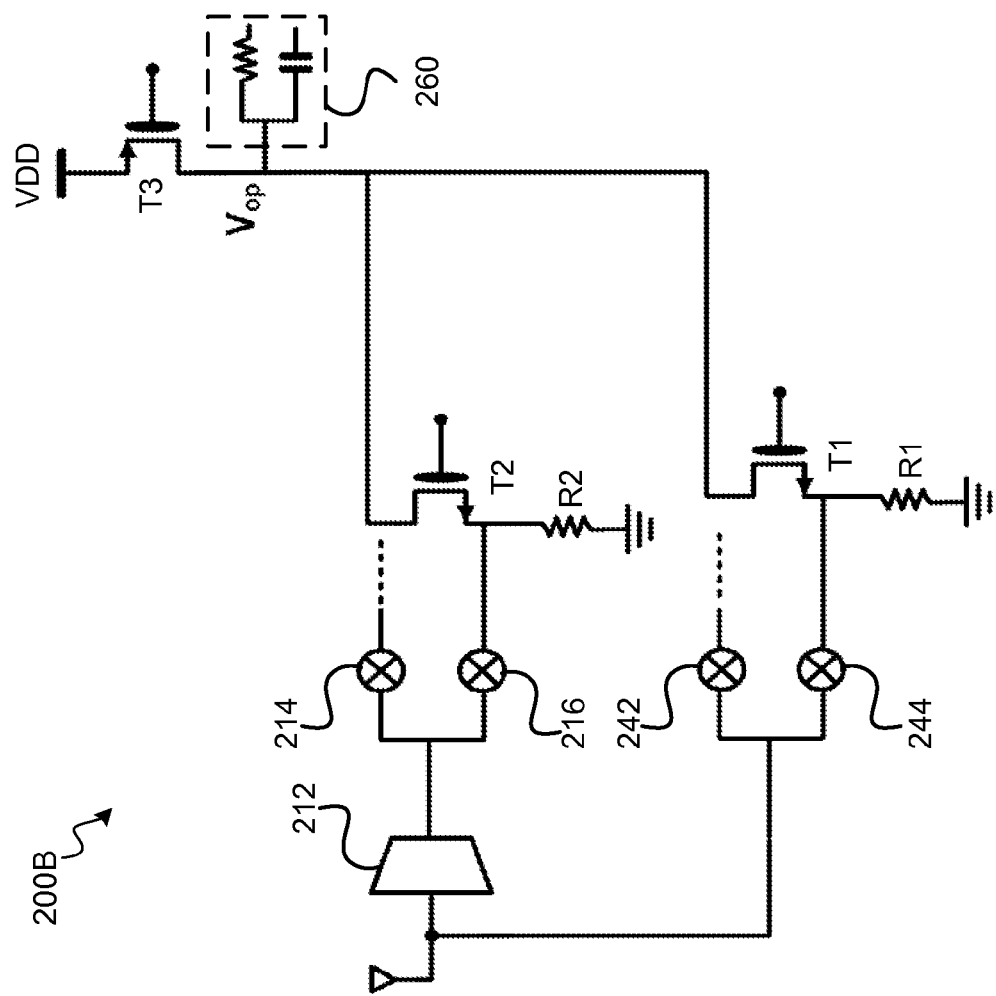
FIG. 2B illustrates an example compact noise-cancellation receiver with a shared TIA load in accordance with one or more implementations.
Figure 2A:
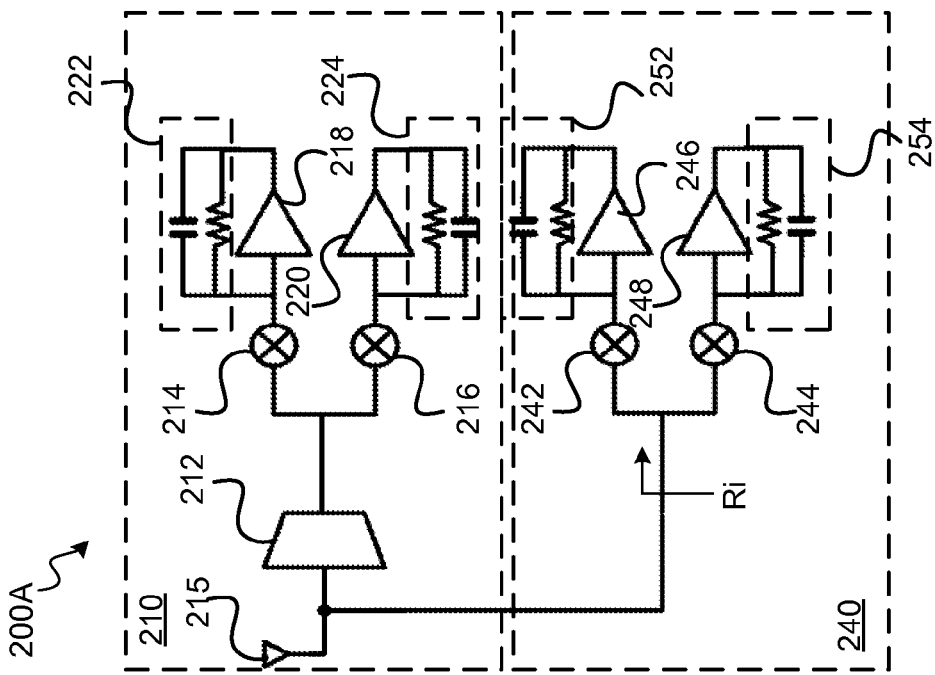
FIG. 2A illustrates an example noise-cancellation receiver in accordance with one or more implementations.

FIG. 2A illustrates an example noise-cancellation receiver 200A in accordance with one or more implementations of the subject technology. The noise cancellation receiver 200A includes a main signal path 210 and an auxiliary signal path 240. In one or more aspects, the noise cancellation receiver 200A may include additional main signal paths similar to the main signal path 210. The main signal path 210 may include a main path quadrature mixer formed by an I-channel mixer 214 and a Q-channel mixer 216. The main path quadrature mixer may receive radio frequency (RF) signals from the low-noise amplifier (LNA) 212 which may in turn be coupled to an RF antenna 215. The LNA 212 may be a low-noise trans-conductance amplifier (LNTCA). The I and Q channel mixers 214 and 216 may provide baseband current signals for feedback TIAs 218 and 220, respectively. The output signals from the TIAs 218 and 220 may be converted to digital signals and processed in one or more baseband processing modules (not shown for simplicity). The TIAs 218 and 220 may have RC loads 222 and 224 in their respective feedback loops. The additional main signal paths may have similar mixer TIA combinations with their respective similar RC loads, and may share the same LNA 212 and antenna 215.

The auxiliary signal path 240 may comprise an auxiliary path quadrature mixer formed by I-channel mixer 242 and Q-channel mixer 244. The auxiliary path quadrature mixer may be directly coupled to the RF antenna 215. The auxiliary path 240 may provide an impedance Ri at the input of the I and Q channel mixer 242 and 244, which can match the resistance of the RF antenna 215 (e.g., 50Ω resistance), thereby replacing external matching elements (e.g., a capacitor and an inductor, not shown in FIG. 2A). The auxiliary path may generate an auxiliary baseband signal at the outputs of the TIAs 246 and 248 that can be used by the one or more baseband processing modules to suppress and/or cancel noise and recover information from the received signal. The I and Q channel mixer 242 and 244 may be coupled to TIAs 246 and 248, which include RC loads 252 and 254 in their respective feedback loops.

One disadvantage of the noise-cancellation receiver 200A may relate to the use of a number of RC loads (e.g., 222, 224, 252, and 254), which can increase by the additional main signal paths. It is understood that implementing the capacitor elements used in the RC loads of the noise cancellation amplifier 200A may account for 50-60% of the cheap area. Therefore, a significant advantage may arise from reducing the number of RC loads used in the noise-cancellation receiver 200A. The present disclosure, as discussed below may provide a solution for such a reduction of chip area and provision of a compact noise-cancellation receiver.

FIG. 2B illustrates an example compact noise-cancellation receiver 200B with a shared TIA load 260 in accordance with one or more implementations of the subject technology. In the compact noise-cancellation receiver 200B, significant reduction in cheap area is achieved through elimination of a number of RC loads (e.g., RC loads 222, 224, 252, and 254 of FIG. 2A). The main and the auxiliary signal paths 210 and 240 of FIG. 2A remain the same except for RC loads 222, 224, 252, and 254, which in the noise-cancellation receiver 200B are shared (e.g., shared RC load 260) between the TIAs 218, 220, 246, and 248 of FIG. 2A. For example, LNTCA 212 and I and Q channel mixers 214, 216, 242, and 244 are the same as shown and described with respect to FIG. 2A. The TIAs 218, 220, 246, and 248 are not shown completely, and, for simplicity, only respective input transistors T1 and T2 and source resistors R1 and R2 of TIAs 248 and 220 are shown. The shared RC load 260 may be coupled between a positive output node ($V_{op}$) and a negative output node (not shown for simplicity) of the corresponding TIAs (e.g., TIAs 216 and 248 of FIG. 2A). The sharing of the RC load 260, may be achieved by combing the output nodes of common-gate transistors (e.g., T1 and T2) in current mode. The positive output node (e.g., $V_{op}$) may be coupled to a supply voltage VDD (e.g., 1.5 V) through a PMOS transistor T3. The negative output node (e.g., $V_{on}$, not shown for simplicity) may be coupled to the supply voltage VDD through another PMOS transistor (not shown for simplicity).

Figure 3:
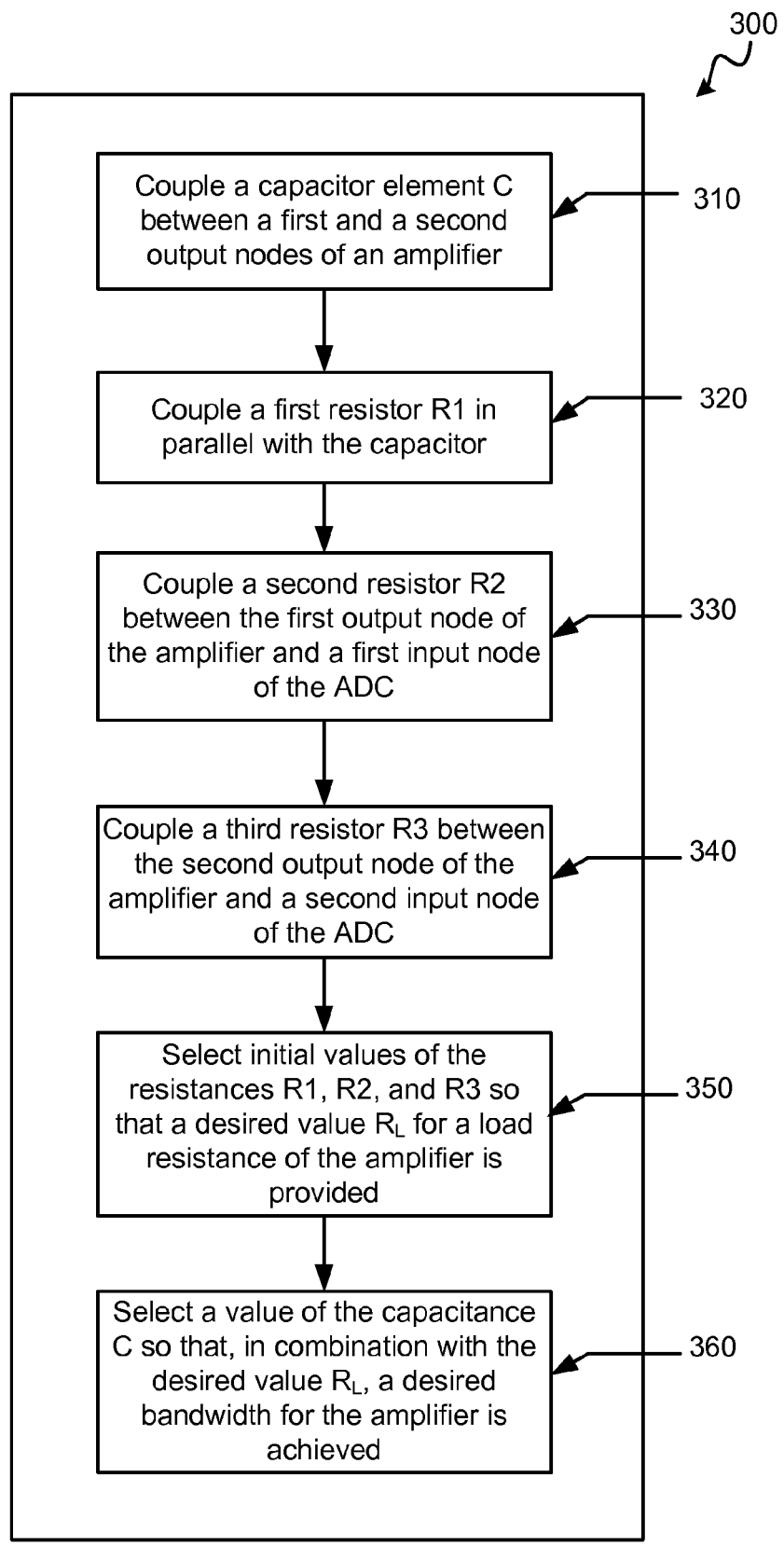
FIG. 3 illustrates an example method for providing a low-noise amplifier to ADC interface with a wide-range of passive gain control in accordance with one or more implementations.

FIG. 3 illustrates an example method 300 for providing a low-noise amplifier to ADC interface with a wide-range of passive gain control in accordance with one or more implementations of the subject technology. For explanatory purposes, the example method 300 is described herein with reference to interface 120 and TIA 110 of FIGS. 1A and 1B; however, the example method 300 is not limited to the interface 120 and TIA 110. Further for explanatory purposes, the blocks of the example method 300 are described herein as occurring in serial, or linearly. However, multiple blocks of the example method 300 may occur in parallel. In addition, the blocks of the example method 300 need not be performed in the order shown and/or one or more of the blocks of the example method 300 need not be performed.

At operation block 310, a capacitor (e.g., capacitor C of FIGS. 1A and 1B) may be coupled between a first and a second output nodes (e.g., 112 and 114 of FIGS. 1A and 1B) of an amplifier (e.g., TIA 110 of FIGS. 1A and 1B). At operation block 320, a first resistor (e.g., resistor R1 of FIG. 1A) may be coupled in parallel with the capacitor C. A second resistor (e.g., resistor R2 of FIG. 1A) may be coupled, at operation block 330, between the first output node 112 of the amplifier and a first input node (e.g., 132 of FIG. 1A) of the ADC (e.g., 130 of FIGS. 1A and 1B). At operation block 340, a third resistor (e.g., resistor R3 of FIG. 1A) may be coupled between the second output node 114 of the amplifier and a second input node (e.g., 134 of FIG. 1A) of the ADC 130.

Initial values of the resistances R1, R2, and R3 may be selected so that a desired value $R_L$ for a load resistance of the amplifier is provided (operation block 350). At operation bock 360, a value of the capacitance C may be selected so that, in combination with the desired value $R_L$ for the load resistance, a desired bandwidth for the amplifier is achieved.

In one or more implementation, the low-noise amplifier to ADC interface of FIG. 1A may be realized in a wireless communication device described below.

Figure 4:
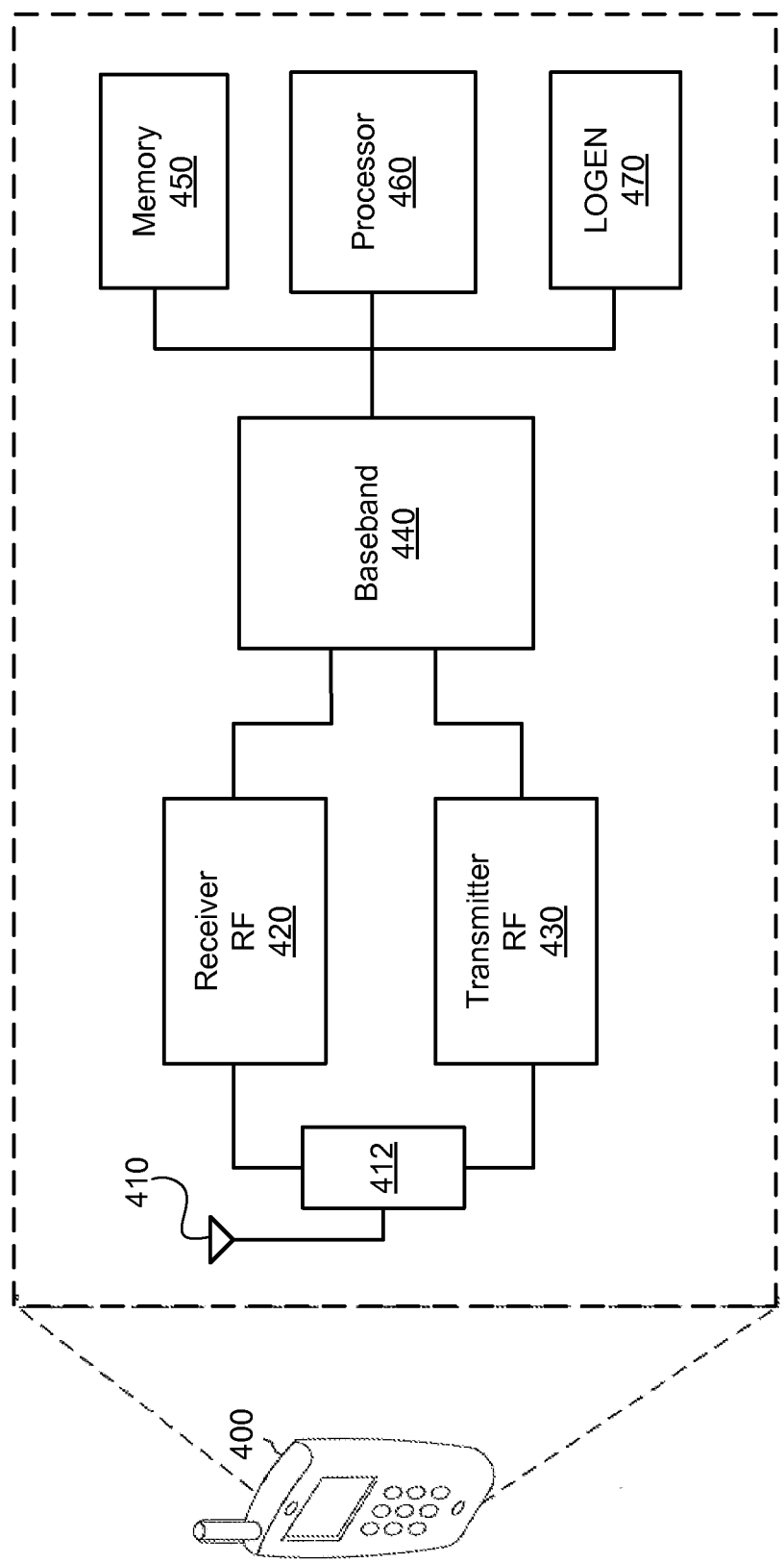
FIG. 4 illustrates an example wireless communication device in accordance with one or more implementations.

FIG. 4 illustrates an example wireless communication device 400 in accordance with one or more implementations of the subject technology. The wireless communication device 400 may comprise a radio-frequency (RF) antenna 410, a receiver 420, a transmitter 430, a baseband processing module 440, a memory 450, a processor 460, and a local oscillator generator (LOGEN) 470. In various embodiments of the subject technology, one or more of the blocks represented in FIG. 4 may be integrated on one or more semiconductor substrates. For example, the blocks 420-470 may be realized in a single chip or a single system on chip, or may be realized in a multi-chip chipset.

The RF antenna 410 may be suitable for transmitting and/or receiving RF signals (e.g., wireless signals) over a wide range of frequencies. Although a single RF antenna 410 is illustrated, the subject technology is not so limited.

The receiver 420 may comprise suitable logic circuitry and/or code that may be operable to receive and process signals from the RF antenna 410. The receiver 420 may, for example, be operable to amplify and/or down-convert received wireless signals. In various embodiments of the subject technology, the receiver 420 may be operable to cancel noise in received signals and may be linear over a wide range of frequencies. In this manner, the receiver 420 may be suitable for receiving signals in accordance with a variety of wireless standards. Wi-Fi, WiMAX, Bluetooth, and various cellular standards. In various embodiments of the subject technology, the receiver 420 may not require any SAW filters and few or no off-chip discrete components such as large capacitors and inductors.

The transmitter 430 may comprise suitable logic circuitry and/or code that may be operable to process and transmit signals from the RF antenna 410. The transmitter 430 may, for example, be operable to up-convert baseband signals to RF signals and amplify RF signals. In various embodiments of the subject technology, the transmitter 430 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 430 may be operable to provide signals for further amplification by one or more power amplifiers.

The duplexer 412 may provide isolation in the transmit band to avoid saturation of the receiver 420 or damaging parts of the receiver 420, and to relax one or more design requirements of the receiver 420. Furthermore, the duplexer 412 may attenuate the noise in the receive band. The duplexer may be operable in multiple frequency bands of various wireless standards.

The baseband processing module 440 may comprise suitable logic, circuitry, interfaces, and/or code that may be operable to perform processing of baseband signals. The baseband processing module 440 may, for example, analyze received signals and generate control and/or feedback signals for configuring various components of the wireless communication device 400 such as the receiver 420. The baseband processing module 440 may be operable to encode, decode, transcode, modulate, demodulate, encrypt, decrypt, scramble, descramble, and/or otherwise process data in accordance with one or more wireless standards.

The processor 460 may comprise suitable logic, circuitry, and/or code that may enable processing data and/or controlling operations of the wireless communication device 400. In this regard, the processor 460 may be enabled to provide control signals to various other portions of the wireless communication device 400. The processor 460 may also control transfers of data between various portions of the wireless communication device 400. Additionally, the processor 460 may enable implementation of an operating system or otherwise execute code to manage operations of the wireless communication device 400.

The memory 450 may comprise suitable logic, circuitry, and/or code that may enable storage of various types of information such as received data, generated data, code, and/or configuration information. The memory 450 may comprise, for example, RAM, ROM, flash, and/or magnetic storage. In various embodiment of the subject technology, Information stored in the memory 450 may be utilized for configuring the receiver 420 and/or the baseband processing module 440.

The local oscillator generator (LOG EN) 470 may comprise suitable logic, circuitry, interfaces, and/or code that may be operable to generate one or more oscillating signals of one or more frequencies. The LOGEN 470 may be operable to generate digital and/or analog signals. In this manner, the LOGEN 470 may be operable to generate one or more clock signals and/or sinusoidal signals. Characteristics of the oscillating signals such as the frequency and duty cycle may be determined based on one or more control signals from, for example, the processor 460 and/or the baseband processing module 440.

In operation, the processor 460 may configure the various components of the wireless communication device 400 based on a wireless standard according to which it is desired to receive signals. Wireless signals may be received via the RF antenna 410 and amplified and down-converted by the receiver 420. The baseband processing module 440 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 450, and/or information affecting and/or enabling operation of the wireless communication device 400. The baseband processing module 440 may modulate, encode and perform other processing on audio, video, and/or control signals to be transmitted by the transmitter 430 in accordance to various wireless standards.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a low-noise interface between at least one amplifier and an analog-to-digital converter (ADC), the circuit comprising:
   a capacitor element having a capacitance C coupled between a first and a second output nodes of the at least one amplifier;
   a resistor circuit coupled between the capacitor element and input nodes of the ADC,
   wherein:
   a desired value $R_L$ for a load resistance of the at least one amplifier is provided by selecting suitable initial values for resistances of the resistor circuit, and
   a desired bandwidth for the at least one amplifier is achieved by selecting a value of the capacitance C based on the desired value $R_L$ for the load resistance.

2. The circuit of claim 1, wherein the resistor circuit comprises:
   a first resistor having a resistance R1 coupled in parallel with the capacitor;
   a second resistor having a resistance R2 coupled between the first output node of the at least one amplifier and a first input node of the ADC; and
   a third resistor having a resistance R3 coupled between the second output node of the at least one amplifier and a second input node of the ADC.

3. The circuit of claim 2, wherein the first, second, and third resistors are variable resistors, and wherein a gain of the at least one amplifier loaded with the low-noise interface is controlled by concurrently varying values of the resistances R1, R2, and R3.

4. The circuit of claim 3, wherein;
   concurrently varying values of the resistances R1, R2, and R3 keeps the achieved desired bandwidth unaffected,
   the desired bandwidth is set by an output-pole frequency of the at least one amplifier, the output-pole frequency being controlled by the values of the capacitance C and the value $R_L$ of the load resistance, and
   the gain of the at least one amplifier loaded with the low-noise interface is controllable in small steps over a range of approximately 30 dB.

5. The circuit of claim 1, wherein:
   the at least one amplifier is a trans-impedance amplifier (TIA), the TIA is a complementary common-gate TIA, and
the TIA receives input signals from a differential mixer circuit.

6. The circuit of claim 1, wherein the at least one amplifier comprises main-path amplifiers and auxiliary-path amplifiers of a noise-cancellation receiver circuit, and wherein the noise-cancellation receiver circuit comprises:
at least one main signal path coupled through a low-noise amplifier (LNA) to an antenna, each of the at least one main signal path including a quadrature mixer coupled to the main-path amplifiers; and
an auxiliary signal path coupled to the antenna, the auxiliary signal path including a quadrature mixer coupled to the auxiliary-path amplifiers,
wherein the main-path amplifiers and the auxiliary-path amplifiers are configured to share a single load.

7. The circuit of claim 6, wherein:
output signals of the main-path amplifiers and the auxiliary-path amplifiers are combined in current domain,
the main-path amplifiers and the auxiliary-path amplifiers are trans-impedance amplifiers (TIAs), and
the TIAs are common-gate complementary TIAs.

8. The circuit of claim 6, wherein the single load comprises an RC load, and wherein the RC load includes the capacitance C and the load resistance $R_L$.

9. The circuit of claim 8, wherein a reduction of on-chip capacitance area of approximately 50% is achieved through sharing the RC load by the main-path amplifiers and the auxiliary-path amplifiers.

10. A method for providing a low-noise interface between at least one amplifier and an analog-to-digital converter (ADC), the method comprising:
coupling a capacitor element having a capacitance C between a first and a second output nodes of the at least one amplifier;
coupling a resistor circuit between nodes of the capacitor element and input nodes of the ADC;
selecting suitable initial values for resistances of the resistor circuit to achieve a desired value $R_L$ for a load resistance of the at least one amplifier; and
selecting a value of the capacitance C based on the desired value $R_L$ for the load resistance to achieve a desired bandwidth for the at least one amplifier.

11. The method of claim 10 further comprising configuring the resistor circuit by coupling:
a first resistor having a resistance R1 in parallel with the capacitor;
a second resistor having a resistance R2 between the first output node of the at least one amplifier and a first input node of the ADC; and
a third resistor having a resistance R3 between the second output node of the at least one amplifier and a second input node of the ADC.

12. The method of claim 11 wherein the first, second, and third resistors are variable resistors, and further comprising controlling a gain of the at least one amplifier loaded with the low-noise interface by concurrently varying values of the resistances R1, R2, and R3.

13. The method of claim 12 further comprising:
controlling the gain of the at least one amplifier loaded with the low-noise interface in small steps over a range of approximately 30 dB; and
keeping the achieved desired bandwidth unaffected, while values of the resistances R1, R2, and R3 are concurrently varied, wherein the desired bandwidth is set by an output-pole frequency of the at least one amplifier, the output-pole frequency being controlled by the values of the capacitance C and the value $R_L$ of the load resistance.

14. The method of claim 10 wherein:
the at least one amplifier is a trans-impedance amplifier (TIA),
the TIA is a complementary common-gate TIA, and
the TIA receives input signals from a differential mixer circuit.

15. The method of claim 10 wherein the at least one amplifier comprises main-path amplifiers and auxiliary-path amplifiers of a noise-cancellation receiver circuit, and wherein the noise-cancellation receiver circuit is formed by:
coupling at least one main signal path through a low-noise amplifier (LNA) to an antenna, each of the at least one main signal path including a quadrature mixer coupled to the main-path amplifiers;
coupling an auxiliary signal path to the antenna, the auxiliary signal path including a quadrature mixer coupled to the auxiliary-path amplifiers; and
configuring the main-path amplifiers and the auxiliary-path amplifiers to share a single load.

16. The method of claim 15, further comprising combining, in current domain, output signals of the main-path amplifiers and the auxiliary-path amplifiers, and wherein the main-path amplifiers and the auxiliary-path amplifiers are trans-impedance amplifiers (TIAs), and wherein the TIAs are common-gate complementary TIAs.

17. The method of claim 15, wherein the single load comprises an RC load, and wherein the RC load includes the capacitance C and the load resistance $R_L$.

18. The method of claim 17, further comprising achieving a reduction of on-chip capacitance area of approximately 50% through sharing the RC load by the main-path amplifiers and the auxiliary-path amplifiers.

19. A circuit for a compact noise-cancellation receiver with a shared amplifier load, the circuit comprising:
at least one main signal path coupled through a low-noise amplifier (LNA) to an antenna, each of the at least one main signal path including a quadrature mixer coupled to a main-path amplifier; and
an auxiliary signal path directly coupled to the antenna, the auxiliary signal path including a quadrature mixer coupled to an auxiliary-path amplifier,
wherein:
main-path amplifiers and auxiliary-path amplifiers are configured to share a single load and the auxiliary-path is configured to generate a signal that is used for noise-cancellation,
output signals of the main-path amplifiers and the auxiliary-path amplifiers are combined in current domain, and
the main-path amplifiers and the auxiliary-path amplifiers are trans-impedance amplifiers (TIAs).

20. The circuit of claim 19, wherein:
the auxiliary-path is configured to provide an input impedance at inputs of quadrature mixer that matches the resistance of the antenna,
the TIAs are common-gate complementary TIAS and the single load comprises an RC load, and
a reduction of on-chip capacitance area of approximately 50% is achieved through sharing the RC load by the main-path amplifiers and the auxiliary-path amplifiers.

* * * * *